US012630418B2

(12) United States Patent (10) Patent No.: US 12,630,418 B2
Cargill et al. (45) Date of Patent: May 19, 2026

(54) MEMS ACOUSTIC SENSOR INCLUDING DIAPHRAGM RECESSED COMBINING PARTS

(71) Applicant: AAC ACOUSTIC TECHNOLOGIES (SHENZHEN) CO., LTD., Shenzhen (CN)

(72) Inventors: Scott Lyall Cargill, Eb (GB); Rui Zhang, Shenzhen (CN); Zhenkui Meng, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 478 days.

(21) Appl. No.: 17/717,166

(22) Filed: Apr. 11, 2022

(65) Prior Publication Data

US 2023/0002218 A1 Jan. 5, 2023

(30) Foreign Application Priority Data

Jun. 30, 2021 (CN) .......................... 202121482471.2

(51) Int. Cl.
B81B 7/02 (2006.01)
(52) U.S. Cl.
CPC ........ B81B 7/02 (2013.01); B81B 2201/0257 (2013.01); B81B 2203/0127 (2013.01)
(58) Field of Classification Search
CPC . B81B 7/02; B81B 2201/0257; H04R 19/005; H04R 19/04
See application file for complete search history.

(56) References Cited

U.S. PATENT DOCUMENTS

| | | | |
|---|---|---|---|
| 5,870,482 A * | 2/1999 | Loeppert | G01H 11/06 |
| | | | 381/174 |
| 7,951,636 B2 * | 5/2011 | Lee | B81C 1/00246 |
| | | | 257/419 |
| 8,464,589 B2 * | 6/2013 | Lee | H04R 19/005 |
| | | | 73/715 |
| 9,258,662 B2 * | 2/2016 | Chen | H04R 7/04 |

(Continued)

FOREIGN PATENT DOCUMENTS

| | | | | |
|---|---|---|---|---|
| CN | 106954164 B | * | 5/2020 | ............. H04R 19/04 |
| CN | 112340692 A | * | 2/2021 | ............. H10D 84/00 |

(Continued)

*Primary Examiner* — Ida M Soward
(74) *Attorney, Agent, or Firm* — Wiersch Law Group

(57) ABSTRACT

The invention provides a MEMS acoustic sensor, including: a base with a back cavity; a capacitance system fixed to the base, including a diaphragm that reciprocates in a vibration direction, a back plate spaced from the diaphragm; a first capacitor and a second capacitor formed cooperatively by the diaphragm and the back plate; and a number of through holes in the back plate facing the back cavity. The diaphragm includes a main body part opposite to the back plate for forming the first capacitor, and a plurality of combining parts recessed from the main body part. A projection of the combining part along the vibration direction completely falls into the through hole. The combining part is spaced from an inner wall of the through hole for forming the second capacitor. Due to the configuration of the invention, the acoustic sensor has improved capacitor value.

9 Claims, 3 Drawing Sheets

(56) References Cited

U.S. PATENT DOCUMENTS

| | | | | |
|---|---|---|---|---|
| 9,516,428 B2 * | 12/2016 | Dehe | .................. | B81C 1/00158 |
| 9,518,884 B2 * | 12/2016 | Tsai | ........................ | B81B 3/007 |
| 9,815,685 B2 * | 11/2017 | Chang | ................. | H04R 19/005 |
| 10,250,998 B2 * | 4/2019 | Hsieh | ...................... | B81B 3/007 |
| 10,343,898 B1 * | 7/2019 | Chen | ........................ | H04R 7/08 |
| 10,349,187 B2 * | 7/2019 | Zhan | ........................ | B81B 7/02 |
| 10,425,743 B2 * | 9/2019 | Kasai | .................. | H04R 19/005 |
| 10,737,931 B2 * | 8/2020 | Chang | ................. | B81C 1/00666 |
| 11,317,179 B2 * | 4/2022 | Yoo | ........................ | H04R 19/04 |
| 11,337,005 B2 * | 5/2022 | Kim | ........................ | H04R 7/24 |
| 12,022,270 B2 * | 6/2024 | Su | ....................... | B81C 1/00158 |
| 2007/0064968 A1 * | 3/2007 | Weigold | .............. | H04R 19/005 |
| | | | | 381/369 |
| 2010/0330722 A1 * | 12/2010 | Hsieh | ................... | G01P 15/125 |
| | | | | 257/E21.211 |
| 2014/0077317 A1 * | 3/2014 | Hsieh | .................. | H04R 19/005 |
| | | | | 257/416 |
| 2015/0110309 A1 * | 4/2015 | Park | ..................... | B81B 3/0086 |
| | | | | 381/190 |
| 2016/0142829 A1 * | 5/2016 | Berger | ................ | H04R 19/005 |
| | | | | 381/174 |
| 2019/0082269 A1 * | 3/2019 | Sun | ........................ | H04R 19/04 |
| 2020/0112800 A1 * | 4/2020 | Lee | ..................... | H04R 19/005 |
| 2020/0196065 A1 * | 6/2020 | Pedersen | ............. | H04R 19/005 |
| 2022/0046344 A1 * | 2/2022 | Yoo | ........................ | H04R 19/005 |

FOREIGN PATENT DOCUMENTS

| | | | | | |
|---|---|---|---|---|---|
| JP | 2008259061 A | * | 10/2008 | ............. | H04R 19/04 |
| KR | 20170138947 A | * | 12/2017 | ......... | B81C 1/00158 |
| KR | 20190053522 A | * | 5/2019 | .......... | H04R 31/006 |
| KR | 20200110627 A | * | 9/2020 | .......... | B81B 7/0006 |

* cited by examiner

7

71 77B 73

77A 7A

75

7A

MEMS ACOUSTIC SENSOR INCLUDING DIAPHRAGM RECESSED COMBINING PARTS

FIELD OF THE PRESENT DISCLOSURE

The present invention relates to electromechanical transducers, and more particularly to a MEMS acoustic sensor.

DESCRIPTION OF RELATED ART

With the development of wireless communication, there are more and more mobile phone users worldwide. The user's requirements for mobile phones are not only satisfied with the call, but also must be able to provide high-quality call effects. Especially with the current development of mobile multimedia technology, the call quality of mobile phones is more important. The microphone of the mobile phone is used as the voice pickup device of the mobile phone, and its design directly affects the call quality. As an important component of the microphone, the MEMS acoustic sensor is particularly important.

In the related technology, the capacitor type MEMS acoustic sensor driven by comb teeth can achieve high performance with a signal-to-noise ratio of up to 74 db. However, this capacitor type MEMS acoustic sensor driven by comb teeth still has the problem of low capacitor value and small capacitor change.

SUMMARY OF THE PRESENT INVENTION

One of the main objects of the present invention is to provide a MEMS acoustic sensor with improved capacitor value and capacitor change.

To achieve the above-mentioned objects, the present invention provides a MEMS acoustic sensor, including: a base with a back cavity; a capacitance system fixed to the base, including a diaphragm that reciprocates in a vibration direction, a back plate spaced from the diaphragm; a first capacitor and a second capacitor formed cooperatively by the diaphragm and the back plate; and a plurality of through holes in the back plate facing the back cavity. The diaphragm includes a main body part opposite to the back plate for forming the first capacitor, and a plurality of combining parts recessed from the main body part.

A projection of the combining part along the vibration direction completely falls into the through hole; and the combining part is spaced from an inner wall of the through hole for forming the second capacitor.

In addition, the combining part includes a first part spaced from the main body part and a second part connecting the main body part to the first part; the main body part forms the second part by bending and extending at the recess.

In addition, the second part is perpendicular to the main body part; and the first part is perpendicular to the second part.

In addition, the back plate includes n first beams and m second beams alternately arranged and enclosed for forming a plurality of through holes; the first beam and the m second beams are staggered to form m nodes; the second beam and the n first beams are interlaced to form n nodes; both n and m are positive integers not less than 2.

In addition, the back plate further includes a center part radiating outward on a same plane for forming n first beams; the n second beams are all ring structures centered on the center part.

In addition, the center part forms the through hole.

In addition, the n first beams are arranged at equal angle intervals, or/and, the m second beams are arranged at equal intervals.

In addition, the second beam is a regular polygon; and a junction of the two adjacent sides of the second beam is located on the node; or, the second beam is circular.

In addition, an end of the first beam away from the center part is fixed to the base.

In addition, the MEMS acoustic sensor includes an isolation layer between the diaphragm and the back plate, and between the back plate and the base.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to several exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Embodiment 1

Figure 1:
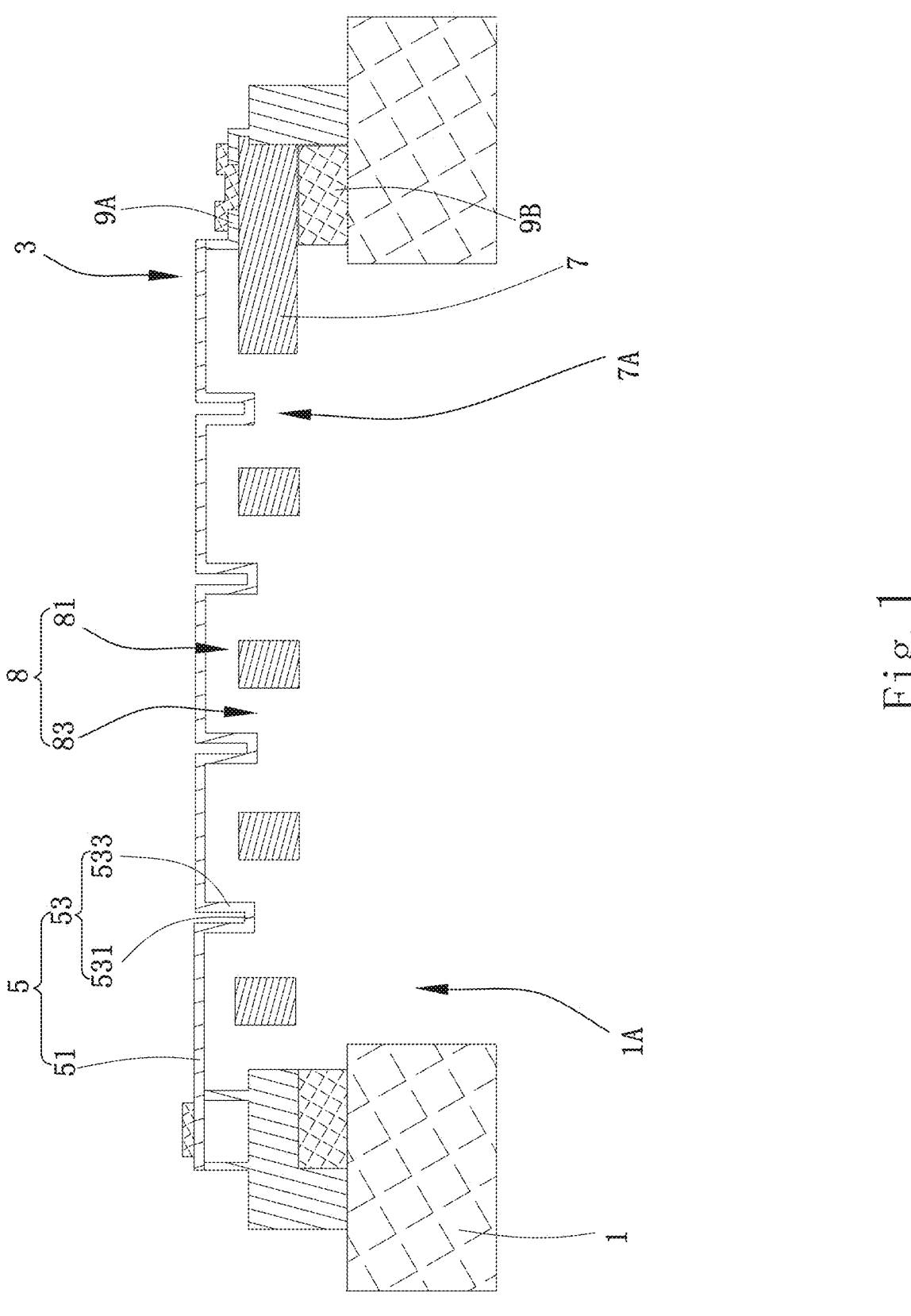
FIG. 1 is a cross-sectional view of a MEMS acoustic sensor in accordance with an exemplary embodiment of the present invention.
Figure 2:
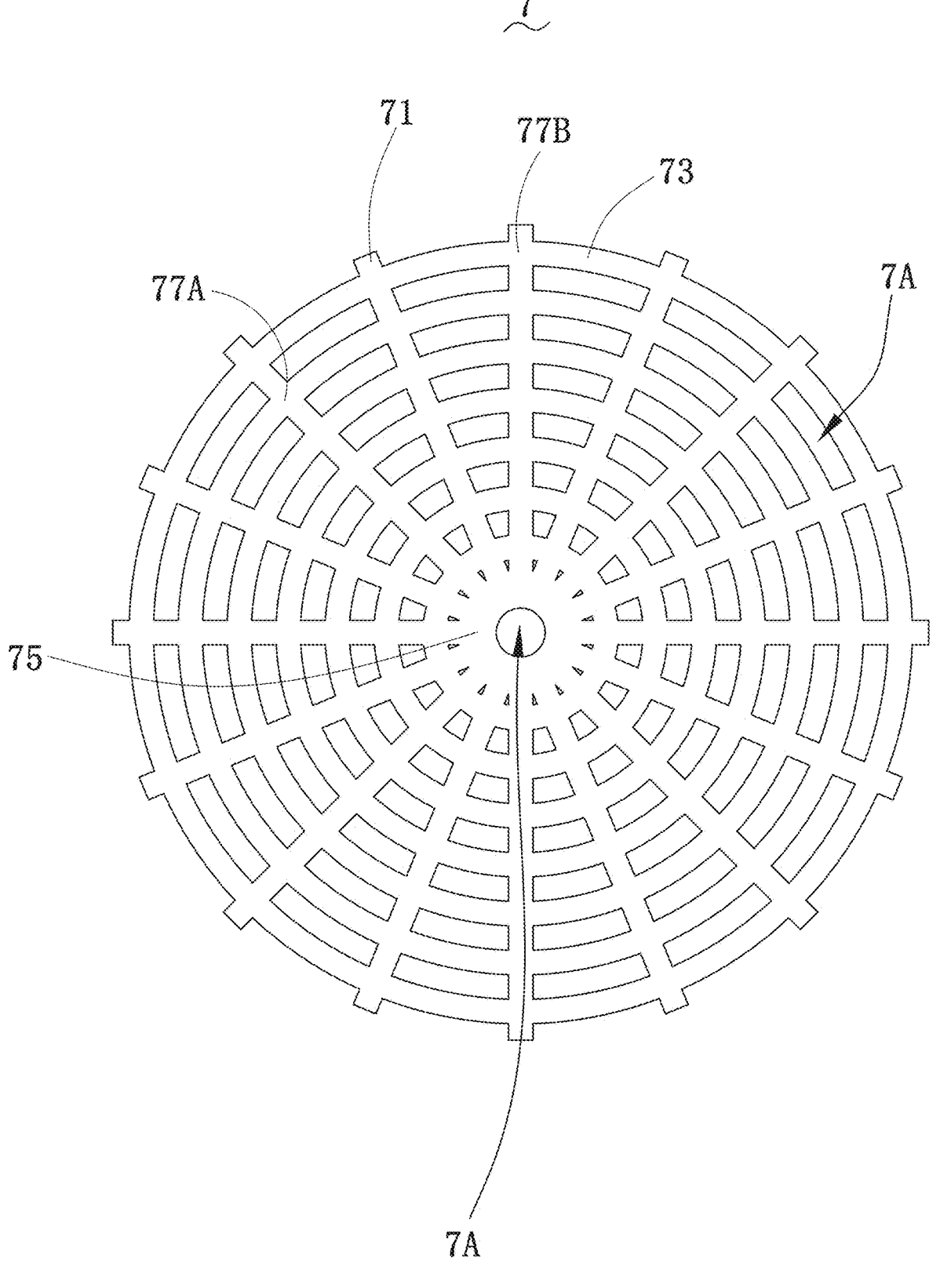
FIG. 2 is a top view of a back plate of the MEMS acoustic sensor shown in FIG. 1.

Please refer to FIG. 1 and FIG. 2. A MEMS acoustic sensor includes a base 1 with a back cavity 1a and a capacitance system 3 fixed to the base 1.

The capacitance system 3 includes a diaphragm 5 that reciprocates along the vibration direction X and a back plate 7 that is spaced apart from the diaphragm 5 to form a capacitor 8. The capacitor 8 includes a first capacitor 81 and a second capacitor 83. A plurality of through holes 7A are provided in the area of the back plate 7 facing the back cavity 1A. The diaphragm 5 includes a main body part 51 opposite to the back plate 7 and spaced apart to form the first capacitor 81, and a plurality of combining parts 53 recessed from the main body part 51.

During operation, the combining part 53 can be inserted into the through hole 7A. The combining part 53 and the inner wall of the through hole 7A are spaced apart to form the second capacitor 83. When pressure (sound wave) acts on the diaphragm 5, the diaphragm 5 moves closer to and away from the back plate 7 along the vibration direction X to reciprocate to make the capacitance of the capacitor 8 between the diaphragm 5 and the back plate 7 Make a change. Therefore, electrical signals corresponding to changes in pressure (sound waves) can be generated. The electric signal is output through an external circuit connected to the capacitance system 3.

At the same time, the second capacitor 83 is formed by inserting the combining part 53 recessed from the main body part 51 into the through hole 7A and spaced apart from the inner wall of the through hole 7A. Not only can the charge distribution area of the capacitance system 3 be increased to increase the capacitor value, but the diaphragm 5 can also increase its elasticity to make its vibration amplitude larger. Therefore, the capacitance change of the first capacitor 81 can be increased to increase the intensity of the generated electrical signal.

In addition, when the diaphragm 5 vibrates, the depth at which the combining part 53 is inserted into the through hole 7A will change (that is, the effective area of the second capacitor 83 formed by the combining part 53 and the inner wall of the through hole 7A will occur). Variety). It is also possible to increase the capacitance change to increase the intensity of the generated electrical signal.

As shown in FIG. 1, the diaphragm 5 and the back plate 7 are fixed by a first isolation layer 9A, and the back plate 7 and the base 1 are fixed by a second isolation layer 9B. Wherein, the first isolation layer 9A and the second isolation layer 9B are made of a material with insulating properties, and the material with insulating properties may be oxide or nitride.

The combining part 53 includes a first part 531 arranged at intervals from the main body part 51 and a second part 533 connecting the main body part 51 and the first part 531. Wherein, the main body part 51 is bending and extending at its recess to form the second part 533. The structure of the combing part 53 is more conducive to improving the elasticity of diaphragm 5.

As shown in FIG. 1, the second part 533 is perpendicular to the main body part 51. The first part 531 is perpendicular to the second part 533.

The back plate 7 includes n first beams 71, m second beams 73 and a center part 75. The center part 75 radiates outward on the same plane to form n first beams 71. The m second beams 73 are all annular structures centered on the center part 75. In addition, the n first beams 71 and m second beams 73 are alternately arranged and enclosed to form a plurality of the through holes 7a. Wherein, each first beam 71 and the m second beams 73 are staggered to form m nodes 77A, m nodes 77A are set at intervals with each other in the extension direction of the first beam 71. Each second beam 73 and the n first beams 71 are staggered to form n nodes 77B, n nodes 77B are set at intervals along the circumferential direction of the second beam 73. Both n and m are positive integers not less than 2.

In this embodiment, the end of the first beam 71 away from the center part 75 is fixed to the base 1. Specifically, the end of the first beam 71 away from the center part 75 is fixed to the second isolation layer 9B and indirectly fixed to the base 1 through the second isolation layer 9B. This kind of back plate 7 passes through a different number of anchor points (the anchor points are: The end of the first beam 71 away from the center part 75) is fixed. The stiffness of the back plate 7 can be increased, thereby reducing the displacement of the back plate 7 under the frequency signal and mechanical vibration. Thereby reducing unnecessary noise to improve the signal-to-noise ratio.

As shown in the figure, a through hole 7A is provided on center part 75; n first beams 71 are arranged at equal angle intervals. The m second beams 73 are arranged at equal intervals.

As shown in the figure, the second beam 73 is arranged in a circular shape. The electrode area of the back plate 7 with such a circular distribution is large (that is, the capacitor 8 formed is large). However, the outer ring will still produce a certain amount of displacement under the frequency signal and mechanical vibration, which will generate noise.

Embodiment 2

Figure 3:
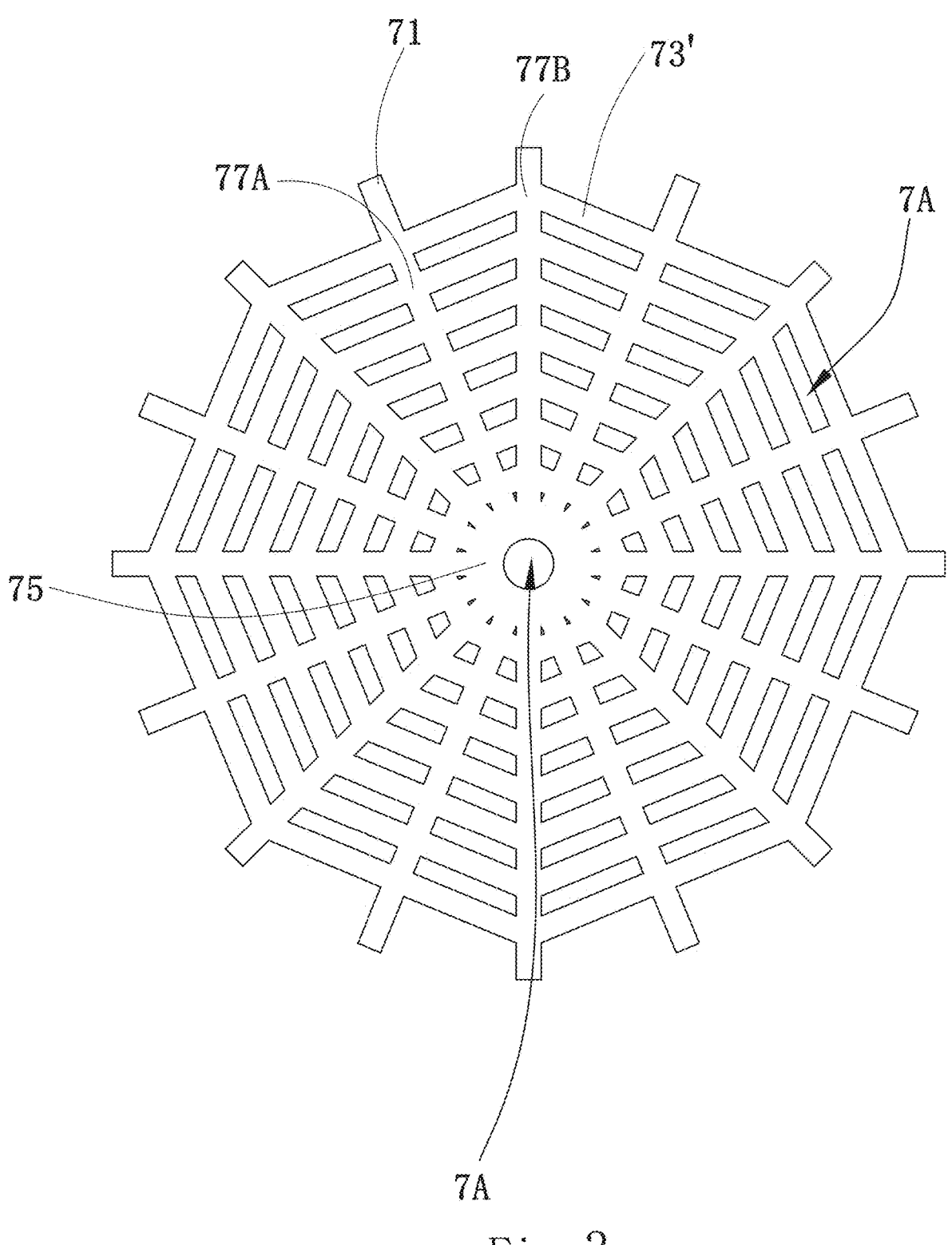
FIG. 3 is top view of another optional back plate of the MEMS acoustic sensor shown in FIG. 1.

Please refer to FIG. 3. The second beam 73' is a regular polygon, and the junction of two adjacent sides of the second beam 73' is located on the node 77. Wherein, the regular polygon can be a regular hexagon, a regular octagon, a regular hexadecagon and other polygons. Compared with the circular back plate 7 (that is, the second beam 73 is arranged in a circular shape), the regular polygonal back plate 7' can ensure that the reduced electrode area is less (That is to say, the capacitor value of the capacitor 8 formed has a smaller decrease), so that the distance between the two anchor points is the shortest (the anchor point is: One end of the first beam 71 away from the center part 75). Thereby reducing the displacement of the outer ring of the back plate 7 under the frequency signal and mechanical vibration, thus reducing the mechanical noise caused by the vibration of the back plate to improve the signal-to-noise ratio.

It should be noted that the structure of the back plate and its connection structure to the base are not limited to the back plate described in embodiment 1 and embodiment 2. For example, in other embodiments, when the second beam is round, the back plate can also be set so that the end of the first beam away from the center part and the second beam on the outermost side can both be fixed to the base.

The back plate can also be set to include only n first beams and m second beams. Wherein, n said first beams are arranged at intervals along the first direction. The m second beams are arranged at intervals along a second direction, and the first direction is not parallel to the second direction. In other words, the back plate 7 can also be arranged in a parallelogram (including rectangular) structure as a whole. Correspondingly, the opposite ends of the first beam and the opposite ends of the second beam are fixed to the base.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS acoustic sensor, including:

a base with a back cavity;

a capacitance system fixed to the base, including a diaphragm that reciprocates in a vibration direction, a back plate spaced from the diaphragm;

a first capacitor and a second capacitor formed cooperatively by the diaphragm and the back plate;

a plurality of through holes in the back plate facing the back cavity; wherein the diaphragm includes a main body part opposite to the back plate for forming the first capacitor, and a plurality of combining parts recessed from the main body part;

a projection of the plurality of combining parts along the vibration direction completely falls into the plurality of through holes, with each combining part corresponding to each through hole; and the plurality of combining parts are spaced from an inner wall of the plurality of through holes for forming the second capacitor;

the first capacitor is formed between the main body part and a part of the back plate that is spaced opposite along the vibration direction; the plurality of combining parts the combining parts are inserted into the plurality of through holes and spaced apart from the inner wall of the plurality of through holes, and the second capacitor is formed between each combining part and the inner wall of each through hole;

the back plate includes n first beams and m second beams alternately arranged and enclosed for forming the plurality of through holes; each first beam and the m second beams are staggered to form m nodes; each second beam and the n first beams are interlaced to form n nodes; both n and m are positive integers not less than 2.

2. The MEMS acoustic sensor as described in claim 1, wherein, each of the plurality of combining parts includes a first part spaced from the main body part and a second part connecting the main body part to the first part; the main body part is bent and extended towards the back plate to form the second part.

3. The MEMS acoustic sensor as described in claim 2, wherein, the second part is perpendicular to the main body part; and the first part is perpendicular to the second part.

4. The MEMS acoustic sensor as described in claim 1, wherein, the back plate further includes a center part radiating outward on a same plane for forming n first beams; the m second beams are all ring structures centered on the center part.

5. The MEMS acoustic sensor as described in claim 4, wherein, the center part forms the plurality of through holes.

6. The MEMS acoustic sensor as described in claim 4, wherein, the n first beams are arranged at equal angle intervals, or/and, the m second beams are arranged at equal intervals.

7. The MEMS acoustic sensor as described in claim 4, wherein, each second beam is a regular polygon; and a junction of the two adjacent sides of each second beam is located on the node; or, each second beam is circular.

8. The MEMS acoustic sensor as described in claim 4, wherein, an end of each first beam away from the center part is fixed to the base.

9. The MEMS acoustic sensor as described in claim 1 including an isolation layer connected between the diaphragm and the back plate, and connected between the back plate and the base.

* * * * *